March 28, 1967 K. CLARK ETAL 3,311,215

ARTICLE LOADING ASSEMBLY

Filed May 27, 1965 2 Sheets-Sheet 1

March 28, 1967 K. CLARK ETAL 3,311,215

ARTICLE LOADING ASSEMBLY

Filed May 27, 1965 2 Sheets-Sheet 2

United States Patent Office 3,311,215
Patented Mar. 28, 1967

3,311,215

ARTICLE LOADING ASSEMBLY

Kendall Clark, Poughkeepsie, and Frank L. De Turris, Wappingers Falls, N.Y., assignors to International Business Machines Corporation, New York, N.Y., a corporation of New York Filed May 27, 1965, Ser. No. 459,384
6 Claims. (Cl. 198—24)

This invention is directed generally to an apparatus for loading articles onto a conveyor and, more particularly, to an apparatus for positively loading substrates containing electrical circuits thereon and electrically conductive pins extending therefrom onto a perforated conveyor belt whereby the pins of the substrate extend through the perforations in the conveyor belt.

In the art of loading articles onto a conveyor belt, it is a well recognized practice to load all the articles onto a chute or some other conveyor-loading mechanism so that the articles can be successively deposited or placed onto the conveyor belt. However, in loading articles, which have pins extending from one surface thereof, onto a perforated conveyor belt which is to receive the articles in such a manner that the pins extending from the articles pass through the perforations in the belt, it is important to be able to positively load the articles directly onto a conveyor belt in order to insure proper positioning of all the pins of the article in each of the perforations of the belt.

In the microelectronic art of forming an electrical circuit on the surface of a substrate, it is essential that the substrate, which has electrically conductive pins extending therefrom, be properly oriented with respect to a reference position to permit accurate formation of portions of the circuit or to permit a work operation thereon. Individual substrates having electrical circuits are generally classified as integrated, monolithic, or hybrid circuit elements depending upon the final configuration of the substrate and the semiconductor devices located thereon. The pin loaded substrates must be generally positioned on a perforated conveyor belt in order to insure that, prior to a masking operation, diffusion operation, conductive land printing operation, or any of the other operations necessary to either form active or passive elements on the substrate, the proper location of the substrate, with respect to the work operation to be performed, is maintained. The active elements on the substrate are the semiconductor devices, such as transistors, diodes, etc., whereas the passive elements are resistors, capacitors, etc. All of the above described work operations on a substrate require that the substrate be properly positioned prior to the performance of a work function thereon. In this manner, duplication of any desired circuit construction can be consistently achieved on each substrate so that the fabrication cost can be reduced to a minimum thereby enabling the use of the final product in large and complex electronic equipment, such as computers.

Consequently, in order to place the substrate onto a conveyor with the pins of the substrate extending through perforations in the conveyor, it is essential that the substrate be positively placed on the conveyor in such a manner that all the pins of the substrate are inserted through the respective perforations in the conveyor. Haphazard dropping or placing the pin loaded substrates onto the perforated conveyor would result in having the surface of each substrate that is to be worked upon, in most cases, improperly positioned for work operation thereon due to failure of some of the pins to extend into the perforations. Accordingly, it is necessary that the substrate loading mechanism properly and positively place each pin loaded substrate consistently onto a perforated conveyor belt whereby all the pins of each substrate extend through the perforations in the conveyor belt thereby insuring that the surface of each substrate that is to be worked upon is flat.

In addition, it is essential in the operation of a substrate loading mechanism for rapidly loading pin loaded substrates onto a perforated conveyor belt that means be provided for detecting when substrates are blocked from being loaded and when substrates are improperly loaded because of bent pins or some other defect in order to promptly shut down the operation of the loading mechanism. This prevents substrates from being conveyed which are improperly loaded thereby causing possible damage to the work performing elements further down the conveyor belt line. In addition, it is desirable to have a substrate loading mechanism that is simply operated and performs a positive loading function with respect to a conveyor belt that is indexed to cooperate with the substrate loading assembly.

Accordingly, it is an object of this invention to provide an improved article loading assembly.

It is another object of this invention to provide an article loading assembly that positively places pin loaded articles onto a perforated conveyor belt with the pins of the article extending through the perforations in the conveyor belt.

It is another object of this invention to provide a substrate loading assembly that is provided with substrate pushing means which cooperate with a substrate loading chute so as to permit positive loading of pin loaded substrates onto a perforated conveyor belt.

It is a further object of this invention to provide a rapid operating, rugged, positive acting substrate loading assembly which permits loading of substrates having pins extending therefrom onto a perforated conveyor belt.

It is another object of this invention to provide a substrate loading assembly which has means for detecting improperly loaded substrates on the conveyor belt and, in addition, has means for detecting blocking of substrates to be loaded onto the conveyor belt thereby shutting down the operation of the substrate loading assembly to prevent subsequent damage from occurring.

It is a still further object of this invention to provide a single driver shaft upon which cams are mounted for operating both a substrate feeding mechanism and a positive substrate positioning mechanism in a substrate loading assembly.

Briefly described, this invention relates to an article loading assembly which comprises means for successively loading articles onto a support member. Pusher means cooperatively associated with the support member are provided for successively pushing the articles on the support member in the direction of a conveyor belt. Article holding and positioning means are also provided for positively retaining the surface of each article and directing the article onto the conveyor belt. Driving means, preferably cam operated, are provided for operating both said pusher means and said article holding and positioning means in synchronism. The article is preferably a pin loaded substrate and the conveyor belt is perforated to permit the pins of the substrate to pass therethrough.

The foregoing and other objects, features and advantages of the invention will be apparent in the following more particular description of preferred embodiments of the invention, as illustrated in the accompanying drawings.

Figures 1, 1A:
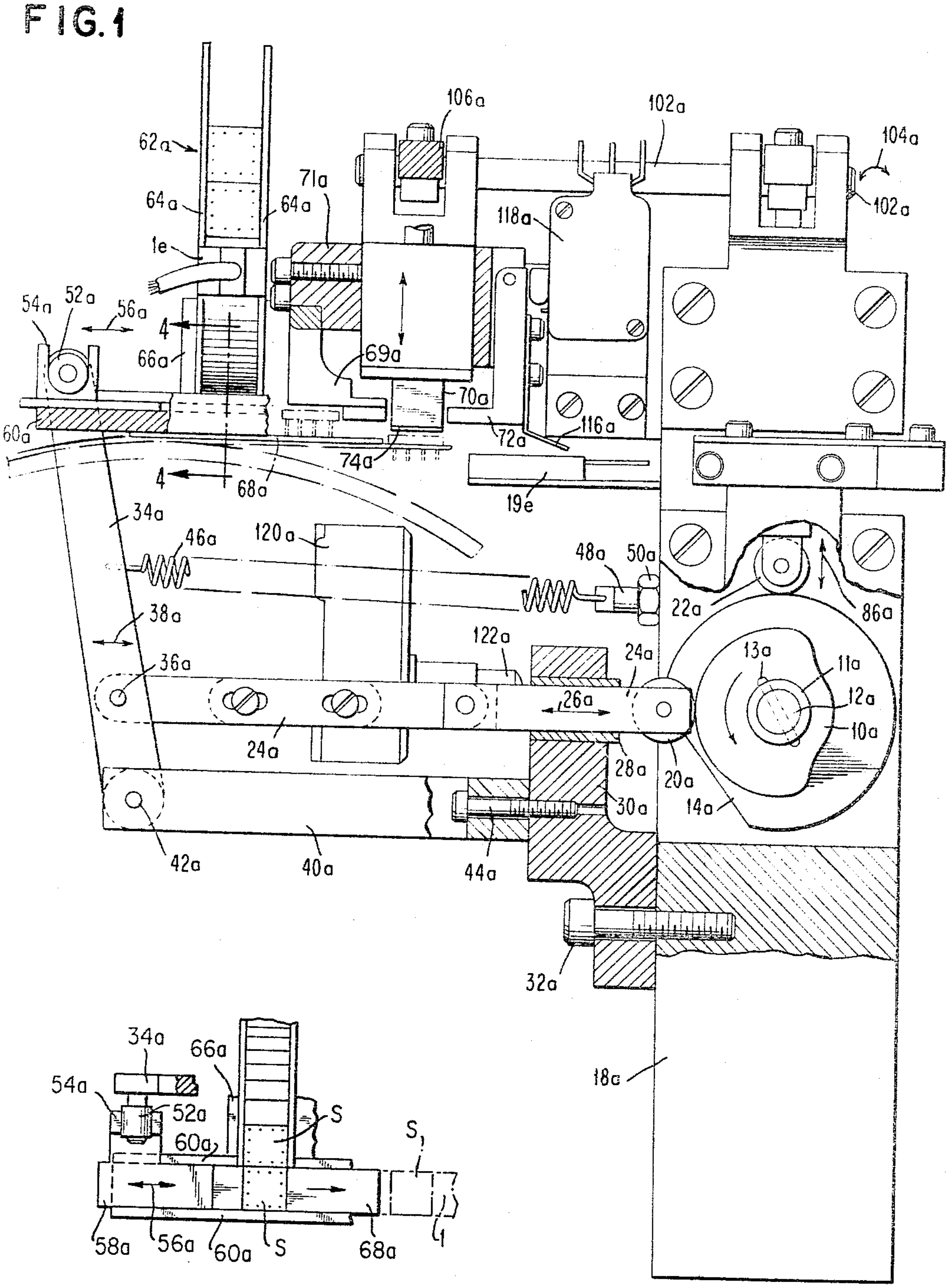
FIG. 1 is an elevational view of the article loading assembly of this invention with parts shown in cross section.
FIG. 1A is a top view showing the operation of the pusher element in cooperation with the substrate containing slide.
Figures 2, 4:
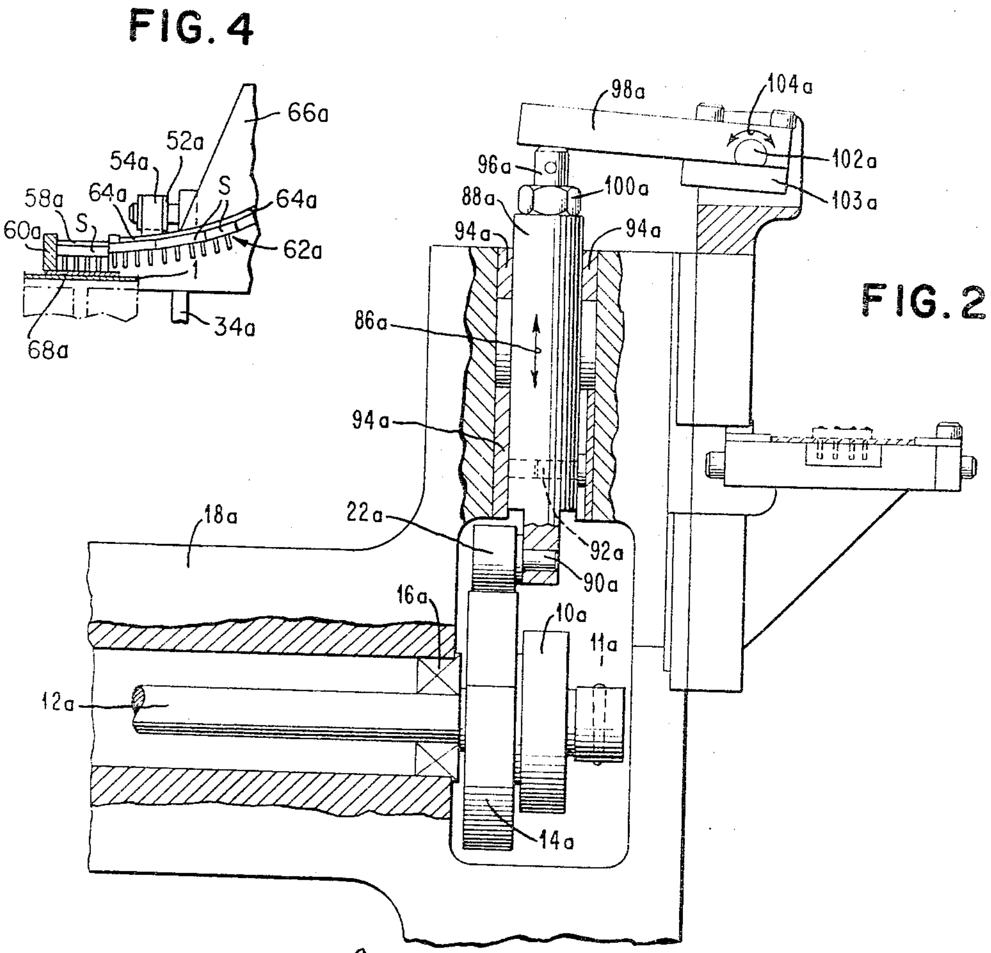
FIG. 2 is an elevational view showing the driving portion of the article loading assembly of FIG. 1.
FIG. 4 is a sectional view taken on the line 4—4 of FIG. 1.

Referring to FIGS. 1 and 2, 10*a* is a cam connected to a shaft 12*a* such as by a key (not shown). Collar 11*a* serves to hold cam 10*a* in position on shaft 12*a* and spline 13*a* holds collar 11*a* on shaft 12*a*. Also connected to shaft 12*a* is cam 14*a* which is adjacent to and larger than the cam 10*a*. Rotation of the shaft 12*a* is permitted by bearing assembly 16*a* connected to frame 18*a* and mounted on the shaft 12*a* adjacent cam 14*a*. Follower rollers 20*a* and 22*a* are in cooperative engagement with cams 10*a* and 14*a*, respectively. Referring to FIG. 1, follower roller 20*a* which is pinned to bar member 24*a* permits reciprocation of the bar member 24*a* in the directions shown by arrows 26*a*. The bar 24*a* is slidably supported within bushing 28*a* located in support member 30*a* which is connected to the frame 18*a* by means of a suitable screw 32*a*. Consequently bar 24*a* which is connected to lever arm 34*a* by pin 36*a* swings the lever arm 34*a* in the direction shown by arrows 38*a*. The lever arm 34*a* is permitted to pivot with respect to support member 40*a* by means of fixed pivot pin 42*a*. The support member 40*a* is attached to the support member 30*a* by means of screw 44*a*. Spring 46*a* is connected between lever arm 34*a* and 48*a* which is screwed into the frame 18*a*. Hence, the spring 46*a* functions to bias the lever arm 34*a* to the right and movement of the bar member 24*a* to the left moves the lever arm 34*a* to the left against the force exerted by the spring 46*a*. Nut 50*a* facilitates adjustment of the lug 48*a* with respect to the frame 18*a*.

Connected to the other end of the lever arm 34*a* is a roller 52*a*, a portion of which is mounted within a U-shaped member 54*a*. The U-shaped member 54*a* is accordingly reciprocated by the reciprocating motion of the roller 52*a* in the directions shown by the arrows 56*a* due to the similar motion of the lever arm 34*a* which is actuated by the bar 24*a* connected to the follower roller 20*a* which cooperates with the cam 10*a*. Connected to the U-shaped member 54*a* is a pusher element 58*a* which is slidably mounted in a groove in support member 60*a*. Hence, reciprocal movement of the U-shaped member 54*a* causes the same reciprocal movement of the pusher element 58*a*. The pusher element 58*a* is preferably a metal strip extending to a desired length in the slot or groove in the support member 60*a*.

Figure 3:
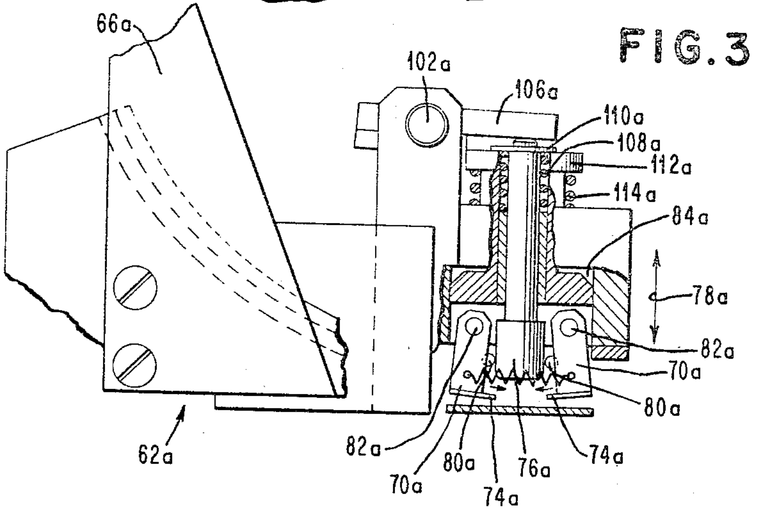
FIG. 3 is a view, with parts in cross section, of the positive positioning mechanism of the article loading assembly of FIG. 1.

Referring to FIGS. 1 and 3, an article containing slide 62*a* is employed for feeding articles or substrates onto the support member 60*a*. The article containing slide 62*a* is preferably a curved set of spaced metal rails or strips 64*a* in which the substrates are slidably positioned and the gravity fed onto the support member 60*a* (FIG. 4). Frame 66*a* supports the article containing slide 62*a*. When the pusher element 58*a* is moved to the right, it cooperates with the article containing slide 62*a* in a manner such as to individually push to the right substrates that are fed from the slide 62*a* onto the support member 60*a*. The substrates with their pins extending downwardly are slid along slide member 68*a* through a bifurcated guide 69*a* to a position where a single substrate is located between a pair of pivot arms 70*a* (FIG. 3). The bifurcated guide 69*a* is connected to frame 71*a*. Stop 72*a* (FIG. 1) functions to stop the substrate from sliding through the pivot arms 70*a*. Extensions 74*a* which are connected to the pivot arms 70*a* function to hold the substrate between the pivot arms 70*a*.

In this position, the substrate is ready to be positively and accurately placed on the belt in such a manner that the pins of the substrate will extend through matching holes in belt 1. Piston 76*a* (FIG. 3), which is caused to reciprocate in the directions shown by arrows 78*a*, functions to place the substrate onto the belt by both the positive engagement with the top surface portion of the substrate and by pushing the pivot arms 70*a* outwardly due to contact between the downwardly moving piston 76*a* and balls 80*a* attached to the pivot arms 70*a*. The pivot arms 70*a* are permitted to swing outwardly by pivot pins 82*a* connected to a frame 84*a*.

The means for creating the reciprocating movement of the piston 76*a* is now described. Referring to FIGS. 1 and 2, the follower roller 22*a* is caused to reciprocate as shown by the arrows 86*a* due to its cooperative relationship with the cam 14*a*. Referring to FIG. 2, the follower roller 22*a* is connected to a bar 88*a* by means of pin 90*a* thereby causing the bar 88*a* to reciprocate with the roller 22*a*.

Pin 92*a* which is inserted in a slot in the bar 88 prevents rotation thereof. Bushing 94*a* located within the frame 18*a* permits the bar 88*a* to reciprocate as shown by arrows 86*a*. Bearing on lug 96*a*, which is threadedly connected to the bar 88*a*, is a lever arm 98*a* which is caused to move up and down with the bar 88*a*. Nut 100*a* permits adjustment of the lug 96*a*. Reciprocal movement of the lever arm 98*a* causes oscillation of the shaft 102*a* which is connected to the lever arm 98*a* by means of a clamp 103*a* as shown in FIG. 2. The oscillating motion of the shaft 102*a* causes lever arm 106*a* (FIG.3), which is connected to the shaft 102*a* in the same manner as the lever arm 98*a* is connected thereto, to move the piston or plunger 76*a* in the downward direction against the force of spring 108*a* when the free end portion of the lever arm 106*a* is moving downwardly.

The spring 108*a* urges head 110*a* upwardly, however, the force of the lever arm 106*a* on the raised portion of the head 110*a* moves the piston or plunger 76*a* into contact with the substrate and also into contact with the balls 80*a* connected to the pivot arms 70*a*. The pivot arms 70*a* are returned to a position normal to the surface of the tape due to the inwardly directed force from a spring. When the head 110*a* of the piston 76*a* reaches the position shown in FIG. 3, contact is made with override head 112*a* which is resiliently supported by spring 114*a*. Accordingly, complete collapse of the spring 108*a* is prevented thereby insuring long life thereof.

In the event the pins of the substrate have not completely entered the holes in the belt thereby causing the substrate to lie at an angle with respect to the belt, due to, for example, bent pins or some other defects, finger 116*a* (FIG. 1), which is positioned to contact improperly oriented substrates, actuates a microswitch 118*a* thereby halting the operation of the loader mechanism. Additionally, a microswitch arrangement connected to bar 24*a* serves to stop the operation of the loader mechanism in the event the lever arm 34*a* is prevented from reciprocating due to blocking of the movement of pusher element 58*a* by improperly positioned substrates. Movable contact portion 122*a* of the microswitch arrangement 120*a* thus fails to contact the support member 30*a* in accordance with the predetermined time cycle when causing the loader mechanism to stop operating. The indexing operation permits substrates loaded onto the belt to be moved progressively to the right.

A photocell 1*e* is operatively connected to the chute 62*a* to detect the presence of a substrate in the chute 62*a*. Switch 19*e* detects the presence of a substrate by contact with the pins thereof before feeding the substrate into the next working operation.

The substrate loading assembly of this invention is particularly useful in the mechanized system described in the patent application entitled "Chip Positioning Machine" assigned to the same assignee of this invention, S.N. 459,179, filed May 27,1965. The electrical circuitry connected to the microswitch control or detector elements of this invention is shown and described in the above identified co-pending application.

The foregoing and other objects, features and advantages of the invention will be apparent from the following more particular description of preferred embodiments of the invention, as illustrated in the accompanying drawings.

We claim:

1. An article loading assembly comprising, in combination, a perforated conveyor belt, chute means for successively loading pin loaded articles onto a support member, pusher means cooperatively associated with said support member for successively pushing said pin loaded articles in the direction of said perforated conveyor belt, article holding and positioning means for retaining each of said moving pin loaded articles and positively pushing each of said pin loaded articles onto said perforated conveyor belt with the pins being inserted through the perforations in said perforated conveyor belt, and driving means for operating both said pusher means and said article holding and positioning means in synchronism.

2. An article loading assembly in accordance with claim 1, including means associated with said pusher means to detect blocking of articles loaded onto said support member and to stop the operation of the loading assembly, and means for detecting articles improperly oriented on said conveyor belt and for stopping the operation of the loading assembly upon detecting an improperly oriented article.

3. An article loading assembly in accordance with claim 1, wherein said pusher means comprising a pusher element slidably mounted in said support member, a lever arm operatively connected to said pusher element to reciprocate said pusher element in said support member, means for actuating said lever arm thereby reciprocating said pusher element, said driving means for operating both said pusher means and said article holding and positioning means being cam operated and operating both said lever arm actuating means and said article holding and positioning means, in synchronism.

4. An article loading assembly comprising, in combination, a perforated conveyor belt, a support member, means for successively loading pin loaded articles onto said support member, pusher means cooperatively associated with said support member for successively pushing each of said articles in the direction of said perforated conveyor belt, article contacting positioning means for stopping each of said moving pin loaded articles and positively contacting the surface of each article and directing said pin loaded article onto said perforated conveyor belt, the pins of said article passing through the perforations in said conveyor belt, said article contacting positioning means comprising a lever actuated plunger member and article holding means for holding each of said pin loaded articles located adjacent to said plunger member, said plunger member movably adapted to contact the surface of said pin loaded article and to release the article from said article holding means thereby directing said pin loaded article onto said perforated conveyor belt, and driving means for operating both said pusher means and said article contacting positioning means in synchronism.

5. An article loading assembly comprising, in combination, a perforated conveyor belt, a support member, means for successively loading pin loaded articles onto said support member, pusher means cooperatively associated with said support member for successively pushing said pin loaded articles in the direction of said perforated conveyor belt, said pusher means comprising a pusher element slidably mounted in said support member, a lever arm operatively connected to said pusher element to reciprocate said pusher element in said support member, means for actuating said lever arm thereby reciprocating said pusher element, article contacting positioning means for stopping each of said moving pin loaded articles and positively contacting the surface of each article and directing said pin loaded article onto said perforated conveyor belt, the pins of said article passing through the perforations in said conveyor belt, said article contacting positioning means comprising a lever actuated plunger member, article holding means for holding each of said pin loaded articles located adjacent to said plunger member, said plunger member movably adapted to contact the surface of each of said pin loaded articles and to release each article from said article holding means thereby directing said pin loaded article onto said perforated conveyor belt, and driving means for operating both said pusher means and said article contacting positioning means in synchronism.

6. A substrate loading assembly comprising, in combination, a perforated conveyor belt, a support member, chute means for successively loading pin loaded substrates onto said support member, pusher means cooperatively associated with said support member for successively pushing each of said pin loaded substrates in the direction of said perforated conveyor belt, said pusher means comprising a pusher element slidably mounted in said support member, a lever arm operatively connected to said pusher element to reciprocate said pusher element in said support member, means for actuating said lever arm thereby reciprocating said pusher element, said lever arm actuating means comprising a reciprocating bar connected to said lever arm, said bar having a follower roller at one end thereof, substrate contacting positioning means for stopping each of said moving pin loaded substrates and positively contacting the surface of each substrate and directing said pin loaded substrate onto said perforated conveyor belt, the pins of said substrate passing through the perforations in said conveyor belt, said substrate contacting positioning means comprising a lever actuated plunger member, substrate holding means for holding each of said pin loaded substrates located adjacent to said plunger member, said substrate holding means comprising a pair of pivot arms having inwardly directed extension portions for holding each of said substrates, said pivot arms being spring loaded toward each other and each of said pivot arms being provided with inwardly directed ball members adapted to contact said plunger member substantially at the lowest position thereof, said plunger member movably adapted to contact the surface of said pin loaded substrate and to release the substrate from said substrate holding means by contacting said ball members of said pivot arms thereby urging said pivot arms outwardly and directing said pin loaded substrate onto said perforated conveyor belt, and cam operated driving means for operating both said pusher means and said article contacting positioning means in synchronism, said cam operated driving means comprising a pair of cams mounted on a rotating driver shaft, one of said cams cooperatively associated with said follower roller of said lever arm actuating means, the other of said cams cooperatively associated with said lever actuated plunger member.

References Cited by the Examiner

UNITED STATES PATENTS

| | | | |
|---|---|---|---|
| 1,726,054 | 8/1929 | Burns | 221—238 X |
| 1,834,723 | 12/1931 | Neff | 221—238 X |
| 1,993,586 | 3/1935 | Bech | 198—34 X |
| 2,050,895 | 8/1936 | Petersen | 221—238 X |
| 2,457,534 | 12/1948 | De Marco | 221—274 X |
| 2,827,159 | 3/1958 | Peteler | 198—232 |
| 2,861,677 | 11/1958 | Van Marle | 198—232 |
| 2,900,072 | 8/1959 | Tully | 198—232 |
| 2,926,774 | 3/1960 | Oppermann | 198—232 |
| 3,204,752 | 9/1965 | Conner | 198—34 |

EVON C. BLUNK, *Primary Examiner.*

M. L. AJEMAN, *Assistant Examiner.*